United States Patent
Xia et al.

(10) Patent No.: US 8,879,665 B2
(45) Date of Patent: Nov. 4, 2014

(54) CONTROLLING A POWER AMPLIFIER BASED ON TRANSMITTER OUTPUT EMISSIONS

(75) Inventors: Ying Xia, Saratoga, CA (US); Sriraman Dakshinamurthy, San Jose, CA (US); Robert Lorenz, Menlo Park, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/491,175

(22) Filed: Jun. 7, 2012

(65) Prior Publication Data

US 2013/0107926 A1    May 2, 2013

Related U.S. Application Data

(60) Provisional application No. 61/494,842, filed on Jun. 8, 2011, provisional application No. 61/611,733, filed on Mar. 16, 2012.

(51) Int. Cl.
| | |
|---|---|
| H04K 1/02 | (2006.01) |
| H04L 25/03 | (2006.01) |
| H04L 25/49 | (2006.01) |
| H03F 3/24 | (2006.01) |
| H03F 1/02 | (2006.01) |
| H03G 3/30 | (2006.01) |

(52) U.S. Cl.
CPC .............. *H03G 3/3042* (2013.01); *H03F 3/24* (2013.01); *H03F 1/0255* (2013.01)
USPC ...................................................... 375/297

(58) Field of Classification Search
USPC ........................................................ 455/127.2
See application file for complete search history.

(56) References Cited

U.S. PATENT DOCUMENTS

| | | | |
|---|---|---|---|
| 2002/0127980 A1* | 9/2002 | Amanullah et al. | ........... 455/127 |
| 2003/0117215 A1* | 6/2003 | O'Flaherty et al. | ........... 330/149 |
| 2008/0280575 A1 | 11/2008 | Pesola | |
| 2009/0197560 A1 | 8/2009 | Rofougaran | |
| 2012/0194271 A1* | 8/2012 | Yamamoto et al. | ........... 330/149 |

OTHER PUBLICATIONS

International Preliminary Report on Patentability directed toward related International Application No. PCT/US2012/041564, issue Dec. 10, 2013 from The International Bureau of WIPO, Geneva, Switzerland; 6 pages.
International Search Report and Written Opinion for PCT Application No. PCT/US2012/041564, dated Oct. 16, 2012, 12 pages.

* cited by examiner

*Primary Examiner* — Chieh M Fan
*Assistant Examiner* — Wednel Cadeau
(74) *Attorney, Agent, or Firm* — Sterne, Kessler, Goldstein & Fox P.L.L.C.

(57) ABSTRACT

Methods and systems for controlling the supply voltage provided to a power amplifier (PA) in a radio frequency (RF) transmitter based on measured output spectrum emissions are provided. In an embodiment, the PA supply voltage is adjusted such that spectrum emission limits are satisfied with predetermined margins. In another embodiment, the predetermined margins are reduced to lower power consumption of the PA.

19 Claims, 8 Drawing Sheets

200

| Δf_OOB (MHz) | Spectrum emission limit (dBm)/ Channel bandwidth | | | | | | | Measurement bandwidth |
|---|---|---|---|---|---|---|---|---|
| | 1.4 MHz | 3.0 MHz | 5 MHz | 10 MHz | 15 MHz | 20 MHz | | |
| ± 0-1 | -10 | -13 | -15 | -18 | -20 | -21 | | 30 kHz |
| ± 1-2.5 | -10 | -10 | -10 | -10 | -10 | -10 | | 1 MHz |
| ± 2.5-2.8 | -25 | -10 | -10 | -10 | -10 | -10 | | 1 MHz |
| ± 2.8-5 | | -10 | -10 | -10 | -10 | -10 | | 1 MHz |
| ± 5-6 | | -25 | -13 | -13 | -13 | -13 | | 1 MHz |
| ± 6-10 | | | -25 | -13 | -13 | -13 | | 1 MHz |
| ± 10-15 | | | | -25 | -13 | -13 | | 1 MHz |
| ± 15-20 | | | | | -25 | -13 | | 1 MHz |
| ± 20-25 | | | | | | -25 | | 1 MHz |

FIG. 2

| | Channel bandwidth / E-UTRA$_{ACLR1}$ / measurement bandwidth | | | | | |
|---|---|---|---|---|---|---|
| | 1.4 MHz | 3.0 MHz | 5 MHz | 10 MHz | 15 MHz | 20 MHz |
| E-UTRA$_{ACLR1}$ | 30 dB | 30 dB | 30 dB | 30 dB | 30 dB | 30 dB |
| E-UTRA channel Measurement bandwidth | 1.08 MHz | 2.7 MHz | 4.5 MHz | 9.0 MHz | 13.5 MHz | 18 MHz |
| Adjacent channel centre frequency offset (in MHz) | +1.4 / -1.4 | +3.0 / -3.0 | +5 / -5 | +10 / -10 | +15 / -15 | +20 / -20 |

FIG. 3A

| | Channel bandwidth / UTRA$_{ACLR1/2}$ / measurement bandwidth | | | | | | |
|---|---|---|---|---|---|---|---|
| | 1.4 MHz | 3.0 MHz | 5 MHz | 10 MHz | 15 MHz | 20 MHz |
| UTRA$_{ACLR1}$ | 33 dB | 33 dB | 33 dB | 33 dB | 33 dB | 33 dB |
| Adjacent channel centre frequency offset (in MHz) | 0.7+BW$_{UTRA}$/2 / -0.7-BW$_{UTRA}$/2 | 1.5+BW$_{UTRA}$/2 / -1.5-BW$_{UTRA}$/2 | +2.5+BW$_{UTRA}$/2 / -2.5-BW$_{UTRA}$/2 | +5+BW$_{UTRA}$/2 / -5-BW$_{UTRA}$/2 | +7.5+BW$_{UTRA}$/2 / -7.5-BW$_{UTRA}$/2 | +10+BW$_{UTRA}$/2 / -10-BW$_{UTRA}$/2 |
| UTRA$_{ACLR2}$ | - | - | 36 dB | 36 dB | 36 dB | 36 dB |
| Adjacent channel centre frequency offset (in MHz) | | | +2.5+3*BW$_{UTRA}$/2 / -2.5-3*BW$_{UTRA}$/2 | +5+3*BW$_{UTRA}$/2 / -5-3*BW$_{UTRA}$/2 | +7.5+3*BW$_{UTRA}$/2 / -7.5-3*BW$_{UTRA}$/2 | +10+3*BW$_{UTRA}$/2 / -10-3*BW$_{UTRA}$/2 |
| E-UTRA channel Measurement bandwidth | 1.08 MHz | 2.7 MHz | 4.5 MHz | 9.0 MHz | 13.5 MHz | 18 MHz |
| UTRA 5MHz channel Measurement bandwidth* | 3.84 MHz | 3.84 MHz | 3.84 MHz | 3.84 MHz | 3.84 MHz | 3.84 MHz |
| UTRA 1.6MHz channel measurement bandwidth** | 1.28 MHz | 1.28 MHz | 1.28 MHz | 1.28 MHz | 1.28 MHz | 1.28 MHz |

* Note: Applicable for E-UTRA FDD co-existence with UTRA FDD in paired spectrum.
** Note: Applicable for E-UTRA TDD co-existence with UTRA TDD in unpaired spectrum.

CONTROLLING A POWER AMPLIFIER BASED ON TRANSMITTER OUTPUT EMISSIONS

CROSS-REFERENCE TO RELATED APPLICATIONS

The present invention claims the benefit of U.S. Provisional Application No. 61/494,842, filed Jun. 8, 2011, and U.S. Provisional Application No. 61/611,733, filed Mar. 16, 2012, both of which are incorporated herein by reference in their entireties.

BACKGROUND

1. Field of the Invention

The present invention relates generally to radio frequency (RF) transmitters.

2. Background Art

Commonly, to ensure compliance with spectrum emission requirements, the supply voltage provided to the power amplifier (PA) in an RF transmitter is increased by a margin above the nominal supply voltage necessary to produce the desired output power of the PA. The margin accounts for variations in temperature, process (i.e., part-to-part variations), and load impedance. For example, commonly, the PA supply voltage is increased so as to achieve a 5 to 6 dB margin in the spectral mask measurements. However, the added margin increases the power dissipation of the PA beyond what is needed to generate the desired output power under nominal conditions.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 2 illustrates the spectrum emission mask of a UE according to the E-UTRA air interface standard as specified by the 3$^{rd}$ Generation Partnership Project (3GPP) Technical Specification (TS) 36.101.

FIG. 3A illustrates the minimum Adjacent Channel Leakage Ratio (ACLR) requirements for E-UTRA.

FIG. 3B illustrates the minimum Adjacent Channel Leakage Ratio (ACLR) requirements for UTRA.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Figure 1:
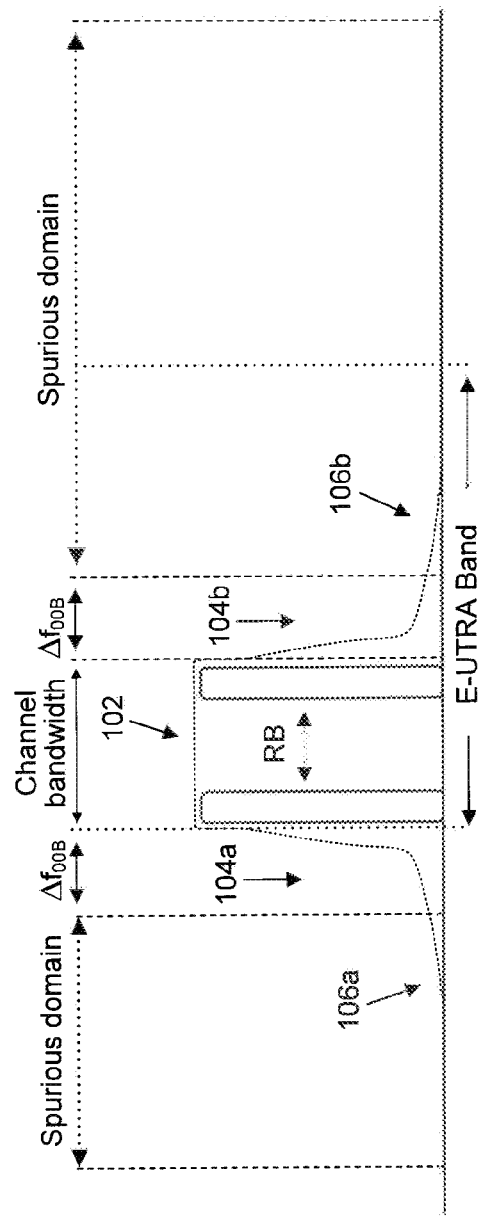
FIG. 1 illustrates an example User Equipment (UE) transmitter radio frequency (RF) spectrum according to the Evolved-Universal. Terrestrial Radio Access (E-UTRA) air interface standard.

FIG. 1 illustrates an example User Equipment (UE) transmitter radio frequency (RF) spectrum 100 according to the Evolved-Universal Terrestrial Radio Access (E-UTRA) air interface standard. As shown in FIG. 1, example RF spectrum 100 consists of in-channel emissions 102, out-of-band (OOB) emissions 104a and 104b, and spurious emissions 106a and 106b.

In-channel emissions 102 include emissions that fall within the assigned E-UTRA channel bandwidth. The assigned E-UTRA channel bandwidth can be between 1.4 MHz and 20 MHz, depending on the number of resource blocks (RBs) being transmitted by the UE.

OOB emissions 104a and 104b include unwanted emissions that fall immediately outside the assigned channel bandwidth and within a $\Delta f_{OOB}$ (MHz) interval from the upper and lower edges, respectively, of the assigned channel bandwidth. Typically, OOB emissions 104a and 104b results from the modulation process as well non-linear amplification in the UE transmitter. As further described below, OOB emissions 104a and 104b are required to comply with spectrum emission mask and Adjacent Channel Leakage Ratio (ACLR) requirements.

Spurious emissions 106a and 106b include unwanted emissions that fall more than $\Delta f_{OOB}$ (MHz) from the upper and lower edges, respectively, of the assigned channel bandwidth. Typically, spurious emissions 106a and 106b include unwanted transmitter emissions such as harmonics of the modulating signal and higher-order modulation and inter-modulation products. Like OOB emissions 104, spurious emissions 106 are subject to emission limits FIG. 2 illustrates the spectrum emission mask (spectral mask) of a UE according to the E-UTRA air interface standard as specified by the 3GPP TS 36.101. As shown in FIG. 2, the spectral mask sets absolute limits for OOB emissions depending on the channel bandwidth. The limits are specified over a $\Delta f_{OOB}$ (MHz) interval from the upper and lower edges of the assigned channel bandwidth. For example, for a channel bandwidth of 1.4 MHz, the spectral mask specifies three maximum power levels that must be met by a UE: −10 dBm for the ±0-1 MHz range immediately outside the channel bandwidth, −10 dBm for the ±1-2.5 MHz ranges away from the upper and lower edges of the channel bandwidth, and −25 dBm for the ±2.5-2.8 MHz ranges away from the upper and lower edges of the channel bandwidth. In addition, the spectral mask specifies a measurement bandwidth over which measurement of the specified spectrum emission limits should be made for compliance purposes.

At any time, the power of an UE emission must not exceed the power limits specified by the spectral mask. As such, the spectral mask represents one performance measure of a UE transmitter, which verifies that the transmitter is not transmitting excessive energy outside of its assigned channel bandwidth.

Another performance measure of a UE transmitter is the Adjacent Channel Leakage Ratio (ACLR). The ACLR is measure of the transmitter energy that is leaking into an adjacent channel. According to the 3GPP TS 36.101. the MIR. is the ratio of the filtered mean power centered on the assigned channel frequency to the filtered mean power centered on an adjacent channel frequency.

FIG. 3A illustrates the ACLR requirements for E-UTRA as specified by the 3GPP TS 36.101. The ACLR requirements specify minimum ratios (expressed in dB) of the assigned channel power to the adjacent channel power for the different assigned channel bandwidth values. Typically, the assigned channel power and the adjacent channel power are measured with rectangular filters with measurement bandwidths as specified by the ACLR requirements. For example, for an assigned channel bandwidth of 1.4 MHz, the measurement bandwidth is 1.08 MHz.

In addition, the ACLR requirements specify an offset (in MHz) from the assigned channel frequency where the adjacent channel power is measured. As shown in FIG. 3A, the offset is equal to the assigned channel bandwidth, i.e., the adjacent channel power is measured one channel away from the assigned channel frequency. The ACLR is the difference, in dB, between the assigned channel power measurement and the adjacent channel power measurement.

Typically, the ACLR is dominated by inter-modulation distortion (IMD) products, especially third-order IMD (IM3) products.

FIG. 3B illustrates the ACLR requirements for UTRA as specified by 3GPP TS 36.101. UTRA ACLR is the ratio of the filtered mean power centered on the assigned E-UTRA channel frequency to the filtered mean power centered on an adjacent UTRA channel frequency. UTRA ACLR is specified for both the first UTRA adjacent channel (UTRA$_{ACLR1}$) and the second UTRA adjacent channel (UTRA$_{ACLR2}$).

Figure 4:
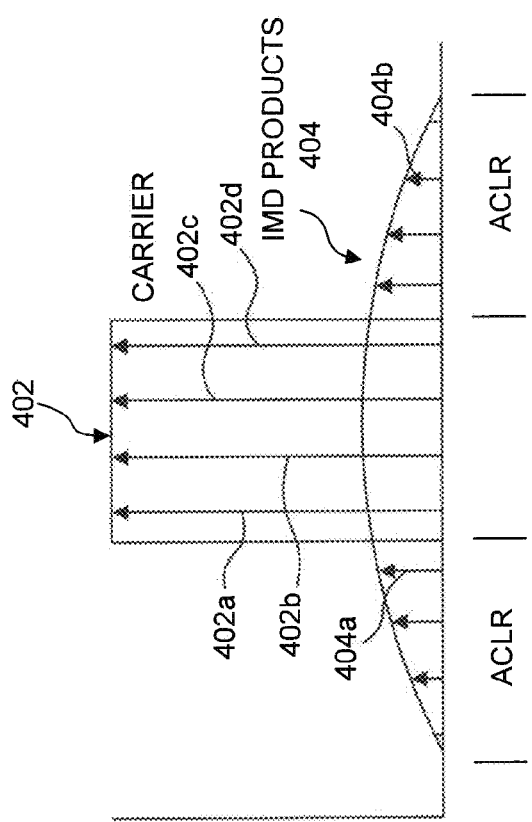
FIG. 4 is an example that illustrates inter-modulation distortion (IMD).

FIG. 4 is an example 400 that illustrates inter-modulation distortion (IMD). Example 400 illustrates a wideband RF carrier spectrum 402, modeled, for the purpose of illustration, as a collection of individual subcarriers 402a, 402b, 402c, and 402d distributed in equal intervals across the carrier bandwidth. Each of individual subcarriers 402a, 402b, 402c, and 402d carries a fraction of the total carrier power.

Wideband RF carrier spectrum 402 is typically produced by frequency modulating and power amplifying a baseband signal using a power amplifier (PA). Leakage in the modulation and non-linear amplification by the PA also produce IMD products 404. Generally, IMD products 404 are dominated by IM3 products.

IM3 products result from individual subcarriers 402a, 402b, 402c, and 402d mixing with each other. For any two subcarriers, the IM3 products manifest themselves as unwanted signal on either side of the two subcarriers themselves. For example, the IM3 products resulting from subcarriers 402a and 402b contribute to IMD product 404a and to the power of subcarrier 402c. The IM3 products resulting from subcarriers 402b and 402d also contribute to IMD product 404a and to IMD product 404b.

The power level of IM3 products at the output of a RF transmitter is a function of the PA output power. Typically, a 1 dB increase/decrease in PA output power results in 3 dB increase/decrease in the power level of IM3 products. This implies that a 1 dB increase/decrease in PA output power results in approximately 3 dB increase/decrease in the ACLR of the transmitter, since the ACLR is dominated by IM3 products.

IM3 products, caused by non-linearity of the PA, are also affected by the supply voltage provided to the PA. Generally, IM3 products can be reduced by increasing the supply voltage to the PA, which allows the PA to operate in a more linear fashion and reduce clipping. Hence, commonly, to ensure compliance with the spectral mask, the PA supply voltage is increased by a margin above a nominal supply voltage necessary to produce the desired output power of the PA. The margin accounts for variations in temperature, process (i.e., part-to-part variations), and load impedance. For example, commonly, the PA supply voltage is increased so as to achieve a 5 to 6 dB margin in the spectral mask measurements (mask margin), i.e., the supply voltage is set such that the OOB emission measurements are 5 to 6 dB lower than the limits set by the spectral mask. Alternatively or additionally, the supply voltage may be increased so as to achieve an ACLR margin (i.e., a margin below the ACLR requirement).

As such, the PA is provided with a supply voltage adequate to deliver the desired output power while maintaining compliance with spectral mask and ACLR requirements (hereinafter referred to collectively as spectrum emission requirements) over temperature, process, and load impedance variations. However, the added margin(s) increase the power dissipation of the PA beyond what is needed to generate the desired output power under nominal conditions.

Embodiments of the present invention, as further described below, recognize that if the mask and/or ACLR margin is reduced, the supply voltage provided to the PA, and hence the PA power consumption, can be reduced. For example, it can be shown that if the mask margin is relaxed from 5 dB to 2 dB, the PA power consumption can be reduced by approximately 12%. As such, embodiments seek to reduce the supply voltage provided to the PA, subject to the constraints of delivering the desired output power and meeting the spectrum emission requirements with reduced margins. In embodiments, the PA supply voltage is controlled in response to in-channel and OOB emissions measured at the output of PA and/or ACLR measurements based on these emissions. According to embodiments, OOB emissions may be measured at particular mask corner frequencies as well as at adjacent channel frequencies.

In the following, example embodiments will be provided. These example embodiments are provided for the purpose of illustration and are not limiting. Embodiments will be described with reference to an example transmitter having a particular architecture. Specifically, the example transmitter uses a receiver feedback path and an envelope tracking PA supply voltage (i.e., the PA supply voltage tracks the complex envelope of the output waveform being generated). However, embodiments are not limited to this example transmitter, and can be extended to other transmitter architectures as would be understood by a person of skill in the art based on the teachings herein.

Further, for the purpose of illustration only, embodiments will be described with reference to an example that seeks to optimize the PA supply voltage, subject to a mask margin at a particular mask corner frequency. As would be understood by a person of skill in the art based on the teachings herein, embodiments are not limited to this example. For example, embodiments may have more than one spectrum emission margins, including one or more mask margins (e.g., same or different mask margins at various mask corner frequencies, or a single margin for any OOB frequency) and an ACLR margin (i.e., margin in the ACLR measurement). The PA supply voltage is then selected so as to satisfy all or any number of these margins according to embodiments. Further, these spectrum emission margins can be adjusted together or independent from each other.

Figure 5:
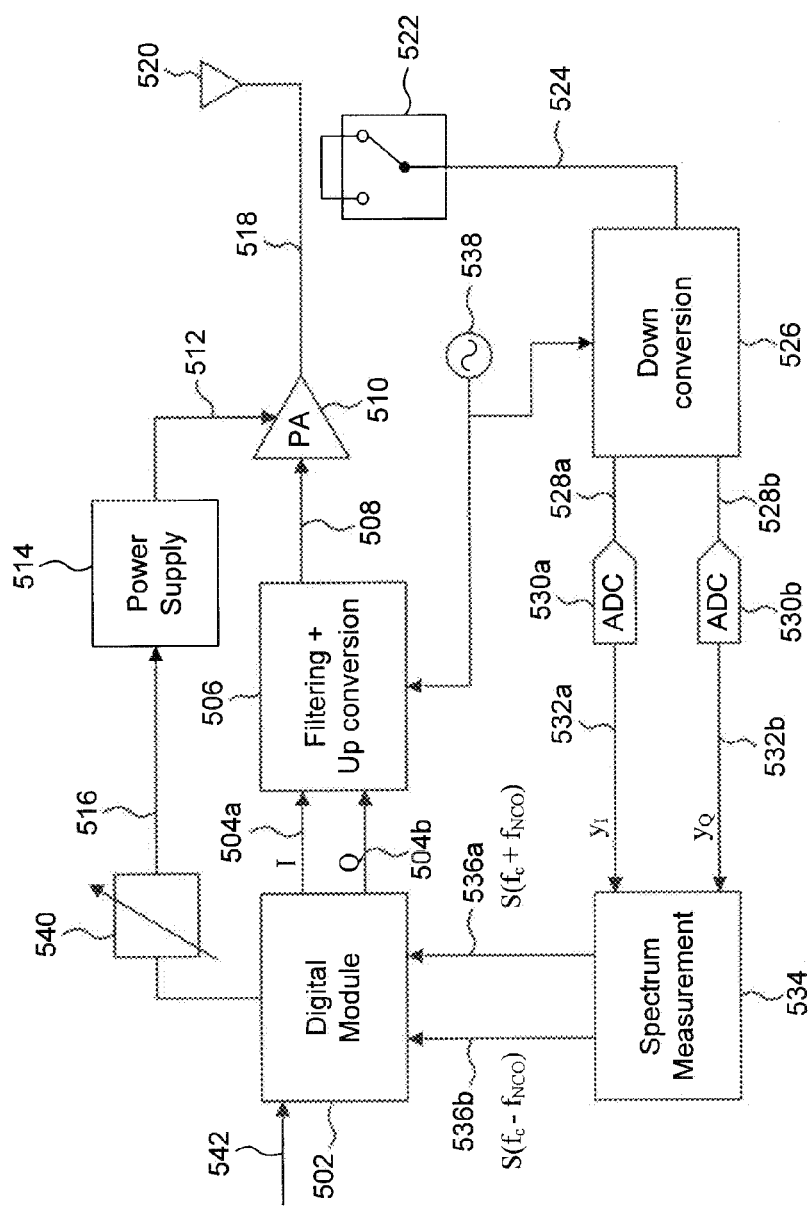
FIG. 5 illustrates an example RF transmitter according to an embodiment of the present invention.

FIG. 5 illustrates an example RF transmitter 500 according to an embodiment of the present invention. Example transmitter 500 can be used to perform embodiments of the present invention.

As shown in FIG. 5, example transmitter 500 includes a digital module 502, a filtering and up-conversion module 506, a power amplifier (PA) 510, a power supply 514, an antenna 520, a directional coupler 522, a down-conversion module 526, Analog-to-Digital converters 530a and 530b, a spectrum measurement module 534, a local oscillator (LO) 538, and a timing adjustment module 540. As would be understood by a person of skill in the art based on the teachings herein, transmitter 500 may include more components than shown in FIG. 5, which are omitted herein for the purpose of clarity.

Digital module 502 generates in-phase (I) and quadrature-phase (Q) signals 504a and 504b based on an input signal 542 to be transmitted. I and Q signals 504a and 504b may be digital or analog. When I and Q signals 504a and 504b are digital, digital-to-analog converters (DACs) (not shown in FIG. 5) are used to convert signals 504a and 504b to analog form, before providing them to filtering and up-conversion module 506. In an embodiment, digital module 502 may pre-distort I and Q signals 504a and 504b to compensate for non-linearities in module 506 and PA 510. In embodiments, digital module 502 may be implemented using hardware and/or software components.

Filtering and up-conversion module 506 performs filtering (e.g., interpolation filtering) and frequency up-conversion on I and Q signals 504a and 504b, and then sums the resulting signals to generate RF signal 508. Module 506 receives a LO signal from LO 538.

PA 510 receives RF signal 508 from filtering and up-conversion module 506, and power amplifies RF signal 508 to generate an output signal 518 for transmission by antenna 520. Output signal 518 is intended to have a desired instantaneous output power level. For 3G and 4G output waveforms, which have a time-varying envelope, the desired instantaneous output power of output signal 518 varies with time.

The amount of power that PA 510 can produce depends on its operating point (i.e., DC bias). Conventionally, to handle 3G/4G waveforms, the PA is designed to operate at a fixed operating point (i.e., fixed bias current and voltage) that allows the PA to handle the peak value of the output waveform envelope (i.e., peak instantaneous output power). However, accordingly, the PA is biased too high for lower envelope values, and thus consumes more power than necessary to produce lower desired instantaneous output power levels. As such, the resulting power efficiency of the PA is very low.

According to embodiments, to increase its power efficiency, the operating point of PA 510 is varied instantaneously according to the envelope (or the desired instantaneous output power) of output signal 518. In other words, the headroom provided by the PA 510 is adjusted according to the swing of input signal 508. In an embodiment, as shown in FIG. 5, this is accomplished using a power supply 514, which adjusts a supply voltage 512 to PA 510 according to the envelope of output signal 518, thus varying the operating point of PA 510 according to the desired instantaneous output power level. In other embodiments, PA 510 includes inputs to adjust the bias setting and the gain setting. In other embodiments, PA 510 may be a multi-stage PA, and each of the multiple stage of PA may be controlled in similar fashion as described above (e.g., by adjusting the supply voltage, bias setting, gain setting, etc.)

Power supply 514 may be an envelope tracking power supply or a switching mode power supply (SMPS). In an embodiment, power supply 514 receives a control signal 516 from digital module 516, and controls supply voltage 512 accordingly. In an embodiment, control signal 516 is produced by determining the modulus of I and Q signals 504a and 504b and then applying it to a look up table (after optionally interpolating the modulus) to determine control signal 516. In an embodiment, where power supply 514 is an envelope tracking power supply, control signal 516 includes an instantaneous voltage. In another embodiment, where power supply 514 is a SMPS, control signal 516 may be a semi-static voltage or control information (provided through a digital interface (e.g., MIPE-RFFE) for example) that sets power supply 514 to a fixed voltage.

In an embodiment, a timing adjustment module 540 may be placed between digital module 502 and power supply 514 in order to synchronize supply voltage 512 with input signal 508 of PA 510.

As described above, commonly, to ensure compliance with the spectral mask, the PA supply voltage is increased by a margin above the nominal supply voltage necessary to produce the desired instantaneous output power of the PA. The margin is intended to account for any variations in temperature, process (i.e., part-to-part variations), and load impedance. Conventionally, the supply voltage margin is fixed, and thus not optimized based on actual temperature, process, and load impedance variations. As a result, more supply voltage than necessary may be provided to the PA in certain cases.

Embodiments provide methods and systems to reduce the supply voltage margin (and hence the PA supply voltage) as much as possible, subject to the constraints of meeting the spectrum emission requirements with predetermined margins. Accordingly, example transmitter 500 includes a feedback path that allows for measuring spectrum emissions (in-channel, OOB, and spurious) of output signal 518 and for adjusting supply voltage 512 accordingly. The feedback path, as shown in FIG. 5, includes a directional coupler 522, a down-conversion module 526, analog-to-digital converters (ADCs) 530a and 530b, and a spectrum measurement module 534.

Directional coupler 522 is coupled to the output of PA 510 so as to receive output signal 518 and generate a RF signal 524. RF signal 524 is provided to down-conversion module 526, which frequency down-converts RF signal 524 and generates baseband analog I and Q signals 528a and 528b. Module 526 receives a LO signal from LO 538. Signals 528a and 528b are digitized by ADCs 530a and 530b, respectively, to generate digital baseband I and Q signals 532a and 532b, which are then provided to spectrum measurement module 534.

Spectrum measurement module 534 acts on digital signals 532a and 532b to measure the power of spectrum emissions in output signal 518. In embodiments, spectrum emissions can be measured at selected frequencies and associated ranges. For example, in addition to in-channel power emissions, OOB emission measurements can be made, without limitation, at particular mask corner frequencies as well as adjacent channel frequencies. The measurement range of a particular measurement can also be varied as desired. When the measurement is being made to test compliance with a particular spectrum emission requirement (e.g., spectral mask or ACLR), the measurement range is set as specified by the spectrum emission requirement in the relevant standard.

In an embodiment, as shown in FIG. 5, spectrum measurement module 534 measures simultaneously, based on the same set of signals 532a and 532b, the power in two frequency bins, one centered at $f_{NCO}$ above a center frequency $f_C$ of the assigned channel bandwidth, and the other centered at $f_{NCO}$ below the center frequency $f_C$ of the assigned channel bandwidth, to generate two output signals 536a and 536b. $f_{NCO}$, as further described below, is provided by a numerically controlled oscillator and can be adjusted as desired. For example, $f_{NCO}$ may be set to a mask corner frequency. As such, output signals 536a and 536b can be used to test compliance with the absolute power limits set by the spectral mask. In another example, $f_{NCO}$ may be set to the center frequency of an adjacent channel. As such, after measuring in-channel power, output signals 536a and 536b can be used to test ACLR compliance.

It is noted that by making simultaneous measurements of spectrum emissions on either side of the center frequency of the assigned channel bandwidth, output signals 536a and 536b may further be used to fine tune the timing alignment of PA supply voltage 512 with input signal 508. Generally, timing misalignment between PA supply voltage 512 and input signal 508 results in asymmetry in the spectrum emissions of output signal 518. In an embodiment, output signals 536a and 536b are compared, and the resulting comparison used to adjust the timing of PA supply voltage 512 relative to input signal 508.

Output signals 536a and 536b are provided to digital module 502,

Digital module 502 uses output signals 536a and 536b to test and ensure compliance with spectrum emission requirements (i.e., spectral mask and ACLR). In an embodiment, digital module 502 uses output signals 536a and 536b in generating control signal 516 to power supply 514, so as reduce PA supply voltage 512 as much as possible, subject to the constraints of meeting the spectrum emission requirements with predetermined margins.

An example of the use of the feedback path of example transmitter 500 to control PA supply voltage 512 based on measured spectrum emissions is now described for the purpose of illustration only. Assume for exemplary purposes that transmitter 500 is transmitting in an assigned channel bandwidth of 1.4 MHz. By design, example transmitter 500 is subject, for example, to a 2 dB desired mask margin in the ±1-2.5 MHz range, away from the assigned channel bandwidth. This requires, based on the spectrum emission limits described in FIG. 2, that any spectrum emission in that range (measured over a 1 MHz bandwidth) not exceed −12 dBm (2 dB below −10 dBm).

Thus, according to embodiments, spectrum measurement module 534 measures, based on signals 532a and 532b, the power in two 1 MHZ-wide frequency bins, one centered at $f_C$+1 MHz and the other centered at $f_C$−1 MHz, to generate output signals 536a and 536b. Signals 536a and 536b are then provided to digital module 502.

Digital module 502 compares either or both of signals 536a and 536b to the spectrum emissions limit being tested. In an embodiment, digital module 502 computes a difference between the spectrum emissions limit and signal 536a/536b, which represents a current mask margin. If the current mask margin is lower than the desired mask margin (2 dB), then the spectrum emissions are too high and must be reduced. Accordingly, digital module 502, via control signal 516, controls power supply 514 to increase PA supply voltage 512 so as to bring the current mask margin to the level of the desired mask margin. On the other hand, if the current mask margin is higher than the desired mask margin, then digital module may cause a decrease in PA supply voltage 512. In an embodiment, digital module 502 may decrease PA supply voltage 512 if the current mask margin exceeds the desired mask margin by a predefined threshold. Otherwise, digital module 502 may leave PA supply voltage 512 unchanged.

In embodiment, digital module 502 determines, based on the current mask margin and the desired mask margin, an amount by which the current mask margin must be increased/decreased, and determines based on this amount a corresponding increase/decrease in PA supply voltage 512 that would accomplish the margin increase/decrease. In embodiments, digital module 502 may use a look up table for making this determination, with the look up table values generated at testing.

In other embodiments, in addition to controlling PA supply voltage 512, digital module 502 may control the gain and/or bias setting of PA 510. In the case PA 510 is a multi-stage PA, digital control module 502 may control the supply voltage, gain setting, and/or bias setting of any of the PA stages of the PA.

As would be understood by a person of skill in the art based on the teachings herein, embodiments are not limited to this example. For example, embodiments may have more than one spectrum emission margins, including one or more mask margins (e.g., same or different mask margins at various mask corner frequencies, or a single margin for any OOB frequency) and an ACLR margin (i.e., margin in the ACLR measurement). The PA supply voltage is then selected so as to satisfy all or any number of these margins according to embodiments. Typically, as shown in FIG. 2, spectrum emission mask requirements specify one emission limit for a range of OOB frequencies. As such, so long as emissions at the edge frequency of the range (mask corner) closest to the center frequency of the assigned channel bandwidth meets the emission limit, spectrum emissions elsewhere in the range generally will also meet the limit. Accordingly, in an embodiment, margins are specified and tested for only mask corner frequencies.

In embodiments, the feedback path of example transmitter 500 is activated periodically to perform the above described spectrum measurement and PA supply voltage adjustment process. This may be done while user data is being transmitted or during a periodic test mode, in which a dummy test waveform is transmitted in order to make spectrum emission measurements. The period selected may be based on anticipated drift of the measured margins due to temperature and load impedance variations, for example. In other embodiments, the feedback path is activated based on the transmission load. For example, the feedback path is activated during periods of heavy transmission to obtain a full characterization of the transmitter performance.

Figure 6:
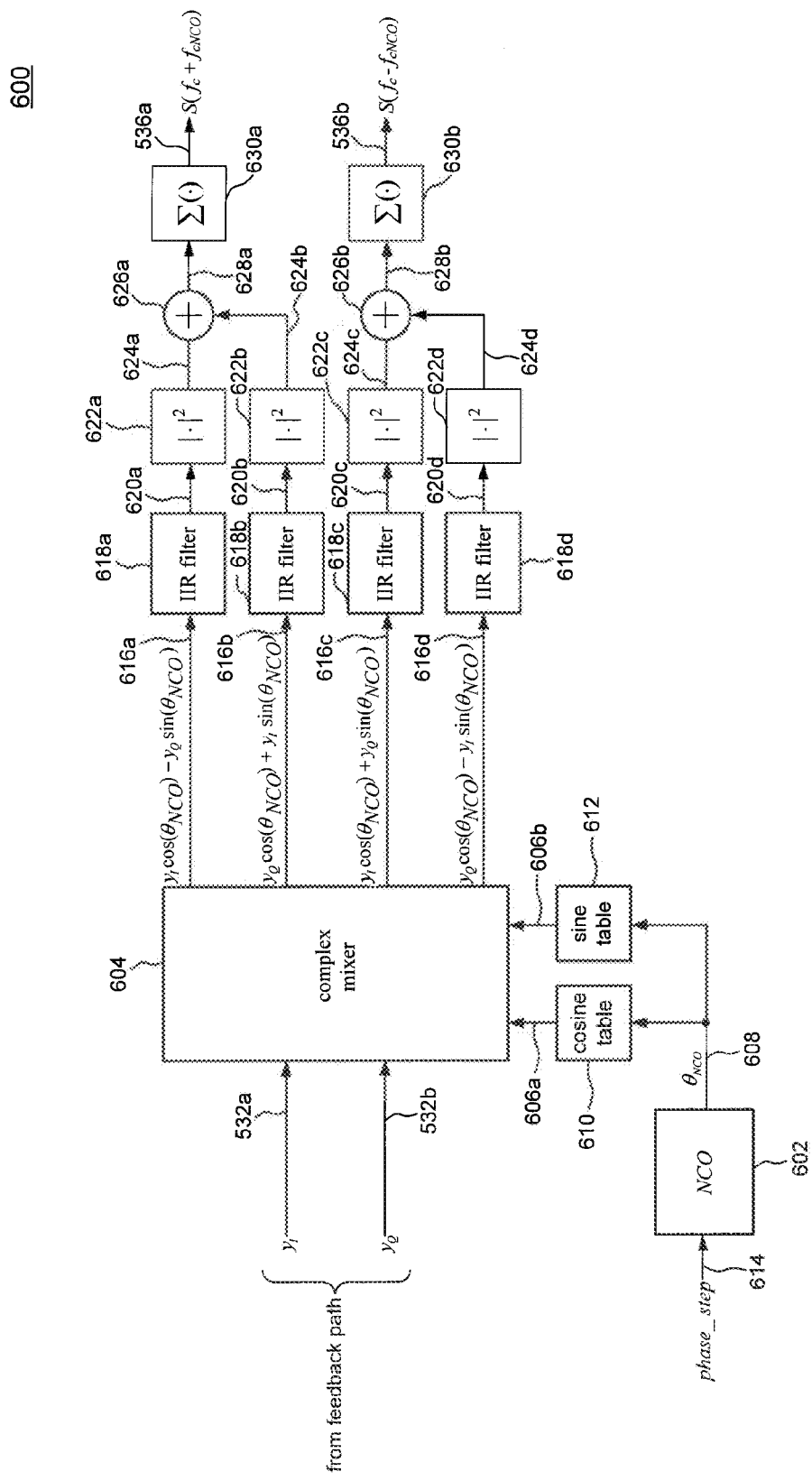
FIG. 6 illustrates an example spectrum measurement module according to an embodiment of the present invention.

FIG. 6 illustrates an example embodiment 600 of spectrum measurement module 534 according to an embodiment of the present invention. As shown in FIG. 6, example embodiment 600 includes a complex mixer 604, a plurality of infinite impulse response (IIR) filters 618a-d, a plurality of squaring modules 622a-d, adders 626a and 626b, and accumulators 630a and 630b. In addition, example embodiment 600 includes a numerically controlled oscillator (NCO) 602, a cosine table 610, and a sine table 612. In another embodiment, NCO 602, cosine table 610, and sine table 612 are external to the spectrum measurement module.

Complex mixer 604 receives signals 532a and 532b from the feedback path of the transmitter, and signals 606a and 606b, which correspond, respectively, to the cosine and sine of an output signal $\theta_{NCO}$ 608 of NCO 602. The frequency of $\theta_{NCO}$ 608 is proportional to phase step 614 and the frequency with which NCO 602 is clocked. $\theta_{NCO}$ 608 determines the frequency offset (from the center frequency of the assigned channel bandwidth) for which output signals 536a and 536b of the spectrum measurement module are generated. As noted above, signals 536a and 536b represent the accumulated power in two frequency bins, one centered at $f_{NCO}$ above a center frequency $f_C$ of the assigned channel bandwidth, and the other centered at $f_{NCO}$ below the center frequency $f_C$ of the assigned channel bandwidth. In an embodiment, $\theta_{NCO}$ 608 can be selected with high resolution using a phase step signal 614.

From signals 532a-b and 606a-b, complex mixer 604 generates signals 616a through 616d, which mathematically correspond to the following signals, respectively:

$$y_I \cos(\theta_{NCO}) - y_Q \sin(\theta_{NCO})$$

$$y_Q \cos(\theta_{NCO}) - y_I \sin(\theta_{NCO})$$

$$y_I \cos(\theta_{NCO}) - y_Q \sin(\theta_{NCO})$$

$$y_Q \cos(\theta_{NCO}) - y_I \sin(\theta_{NCO})$$

Signals 616a and 616b represent, respectively, the real and imaginary components of the output spectrum, shifted up in frequency by an amount equal to $\theta_{NCO}$ 608. Signals 616c and 616d represent, respectively, the real and imaginary components of the output spectrum, shifted down in frequency by the same amount $\theta_{NCO}$ 608.

To measure the output spectrum power over defined measurement bandwidths, signals 616a-d are provided to respective IIR filters 618a-d. IIR filters 618a-d are low-pass filters which filter signals 616a-d to generate respective filtered signals 620a-d. In an embodiment, IIR filters 618a-d are $5^{th}$ order IIR filters. In other embodiments, IIR filters 618a-d may be replaced with finite impulse response (FIR) filters or a combination of IIR and FIR filters.

Filtered signals 620a and 620b represent, respectively, the real and imaginary components contained in a portion of the output spectrum, located at $\theta_{NCO}$ below the center frequency of the assigned channel bandwidth (lower side frequency bin). Filtered signals 620c and 620d represent, respectively, the real and imaginary components contained in a portion of the output spectrum, located at $\theta_{NCO}$ above the center frequency of the assigned channel bandwidth (upper side frequency bin).

Filtered signals 620a-d are provided to respective squaring modules 622a-d, which generate respective signals 624a-d. In other embodiments, squaring modules 622 can be replaced with modules that compute an even order non-linearity of signals 602, and can be implemented as look up tables. Subsequently, signals 624a and 624b are added using adder 626a to generate signal 628a, and signals 624c and 624d are added using adder 626b to generate signal 628b. Signals 628a and 628b represent, respectively, the power contained in the lower side frequency bin and the upper side frequency bin. Signals 628a and 628b are accumulated in respective accumulators 630a and 630b to generate output signals 536a and 536b of the spectrum measurement module.

Figure 7:
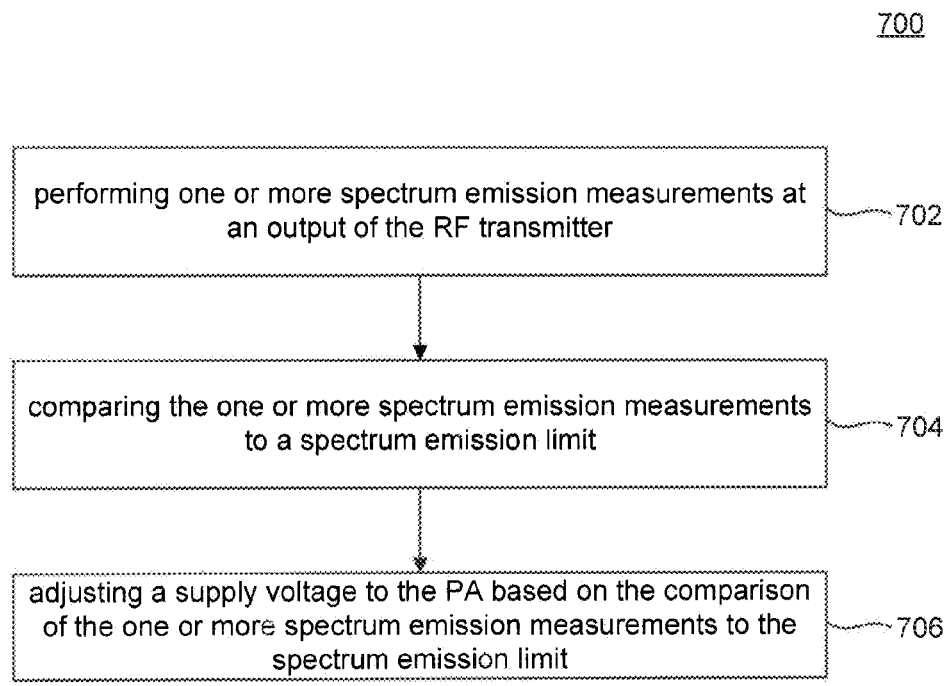
FIG. 7 is a process flowchart of a method of controlling a power amplifier (PA) supply voltage according to an embodiment of the present invention.

FIG. 7 is a process flowchart 700 of a method of controlling a power amplifier (PA) in a RF transmitter according to an embodiment of the present invention.

As shown in FIG. 7, process 700 begins in step 702, which includes performing one or more spectrum emission measurements at an output of the RF transmitter. In an embodiment, step 702 is performed using a receiver-based feedback path and spectrum measurement module, as described above in FIG. 5.

According to embodiments, step 702 may include measuring spectrum emissions at selected frequencies and associated ranges. For example, in addition to in-channel power emissions, OOB emission measurements can be made, without limitation, at particular mask corner frequencies as well as adjacent channel frequencies. The measurement range of a particular measurement can also be varied as desired. When the measurement is being made to test compliance with a particular spectrum emission requirement (e.g., spectral mask or ACLR), the measurement range is set as specified by the spectrum emission requirement in the relevant standard.

The one or more spectrum emission measurements can be made simultaneously or separately. For example, the one or more spectrum emission measurements may be power measurements in two frequency bins, one centered at $f_{NCO}$ above a center frequency $f_C$ of the assigned channel bandwidth, and the other centered at $f_{NCO}$ below the center frequency $f_C$ of the assigned channel bandwidth. $f_{NCO}$ may be set to a mask corner frequency or to the center frequency of an adjacent channel. The one or more spectrum emission measurements may also include in-channel power measurements, which can be used to test ACLR compliance.

Process 700 continues at step 704, which includes comparing the one or more spectrum emission measurements to a spectrum emission limit. In an embodiment, step 704 is performed by a digital module (e.g., baseband processor), as described above in FIG. 5.

According to embodiments, one or more of the spectrum emission measurements can be used in step 704. In an embodiment, step 704 includes comparing at least one of the spectrum emission measurements to a spectrum emission limit. The spectrum emission limit may be specified by the relevant standard that governs the operation of the RF transmitter (e.g., 3 GPP TS 36.101). For example, the spectrum emission limit may be a spectrum emission mask limit or an ACLR limit.

In an embodiment, a spectrum emission requirement defines a minimum desired margin that must be maintained between the spectrum emission measurement and the spectrum emission limit (i.e., the spectrum emission measurement must be lower than the spectrum emission limit, by at least the minimum margin). The spectrum emission requirement may be a design choice of the RF transmitter, intended to account for variations in temperature, process, and load impedance at the output of the RF transmitter.

Accordingly, in an embodiment, step 704 further includes computing a difference between the spectrum emission limit and the at least one spectrum emission measurement. The difference represents a current margin between the spectrum emission limit and the at least one spectrum emission measurement. Subsequently, step 704 further includes comparing the current margin to the minimum desired margin to determine whether or not the spectrum emission margin is satisfied.

In another embodiment, the one or more spectrum emission measurements include an in-channel power measurement and an adjacent channel power measurement. Accordingly, step 704 includes comparing a ratio of the spectrum emission measurements to the spectrum emission limit, where the spectrum emission limit is an ACLR limit. Step 704 may further include computing a difference between the ratio of the spectrum emission measurements and the spectrum emission limit, wherein the difference represents a current margin, and then comparing the current margin to the minimum desired margin defined by the spectrum emission requirement.

Finally, process 700 proceeds to step 706, which includes adjusting a supply voltage to the power amplifier based on the comparison of the one or more spectrum emission measurements to the spectrum emission limit. In an embodiment, step 706 is performed by a digital module (e.g., digital module 502), as described above in FIG. 5. As noted above, by comparing the current margin (between the one or more spectrum emission measurements and the spectrum emission limit) to the minimum desired margin, whether or not the spectrum emission margin is satisfied can be determined.

In an embodiment, if the current margin is lower than the minimum desired margin, then the spectrum emission requirement is not satisfied (i.e., spectrum emissions are too high and must be reduced). As such, in an embodiment, step 706 further includes increasing the supply voltage to the power amplifier so as to bring the current margin to the level of the desired margin. On the other hand, if the current margin is higher than the minimum desired margin, then step 706 may further include decreasing the supply voltage to the PA. In an embodiment, the PA supply voltage is decreased if the current margin exceeds the minimum desired margin by a predefined threshold. Otherwise, the PA supply voltage is kept unchanged.

In an embodiment, step 706 further includes determining, based on the current mask margin and the minimum desired margin, an amount by which the current mask margin must be increased/decreased, and determining based on this amount a corresponding increase/decrease in the supply voltage to the PA that would accomplish the margin increase/decrease.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A method for controlling a power amplifier (PA) in a radio frequency (RF) transmitter, comprising:
   performing spectrum emission measurements at an output of the RF transmitter;
   comparing at least two of the spectrum emission measurements to each other; and
   controlling the PA based at least in part on the comparison of the at least two of the spectrum emission measurements, wherein controlling the PA comprises adjusting a timing between a supply voltage of the PA and an input signal of the PA.

2. The method of claim 1, wherein the spectrum emission measurements include out-of-band emission measurements at one or more spectral mask corner frequencies.

3. The method of claim 1, wherein the spectrum emission measurements include an in-channel emission measurement and an adjacent channel emission measurement.

4. The method of claim 1, wherein the at least two of the spectrum emission measurements include a first emission measurement and a second emission measurement, the first emission measurement corresponding to a first frequency bin centered at an offset frequency above a center frequency of an assigned channel bandwidth, and the second emission measurement corresponding to a second frequency bin centered at the offset frequency below the center frequency of the assigned channel bandwidth.

5. The method of claim 1, further comprising:
   computing a difference between at least one spectrum emission measurement of the spectrum emission measurements and a spectrum emission limit to generate a current margin between the at least one spectrum emission measurement and the spectrum emission limit; and
   comparing the current margin to a minimum desired margin.

6. The method of claim 1, wherein the spectrum emission measurements include an in-channel emission measurement and an adjacent channel emission measurement, the method further comprising:
   computing a ratio of the in-channel emission measurement to the adjacent channel emission measurement;
   computing a difference between the ratio and a spectrum emission limit to generate a current margin; and
   comparing the current margin to a minimum desired margin.

7. The method of claim 5, further comprising:
   if the current margin is lower than the minimum desired margin, increasing the supply voltage to the PA; and
   if the current margin exceeds the minimum desired margin by a predefined threshold, decreasing the supply voltage to the PA.

8. The method of claim 5, wherein the spectrum emission limit is a spectral mask emission limit.

9. The method of claim 6, wherein the spectrum emission limit is an Adjacent Channel Leakage Ratio (ACLR) limit.

10. The method of claim 7, further comprising:
    determining, based on the comparison of the current margin to the minimum desired margin, an amount of desired increase or decrease of the current margin; and
    increasing or decreasing the supply voltage to the PA based on the amount of desired increase or decrease of the current margin.

11. A radio frequency (RF) transmitter, comprising:
    a digital module configured to generate baseband in-phase (I) and quadrature-phase (Q) signals of a desired output waveform;
    a filtering and up-conversion module configured to generate a RF signal from the baseband I and Q signals;
    a power amplifier (PA) configured to power amplify the RF signal to generate an output signal of the RF transmitter; and
    a feedback path comprising:
      a RF receiver configured to receive the output signal of the Rh transmitter and to generate feedback I and Q signals; and
      a spectrum measurement module configured to generate spectrum emission measurements of the output signal based at least in part on the feedback I and Q signals,
    wherein the digital module is further configured to compare at least two of the spectrum emission measurements to each other and to control a timing between a supply voltage of the PA and the Rh signal based at least in part on the comparison of the at least two of the spectrum emission measurements.

12. The Rh transmitter of claim 11, wherein the RF receiver of the Feedback path includes a directional coupler, coupled to an output of the PA.

13. The RF transmitter of claim 11, further comprising:
    a power supply configured to receive a control signal from the digital module and to control the supply voltage of the PA in accordance with the control signal.

14. The RF transmitter of claim 11, wherein the digital module is further configured to compare at least one spectrum emission measurement of the spectrum emission measurements to a spectrum emission limit.

15. The RF transmitter of claim 11, wherein the spectrum emission measurements include an in-channel emission measurement and an adjacent channel emission measurement.

16. The RF transmitter of claim 11, wherein the at least two of the spectrum emission measurements include a first emission measurement and a second emission measurement, the first emission measurement corresponding to a first frequency bin centered at an offset frequency above a center frequency of an assigned channel bandwidth of the RF transmitter, and the second emission measurement corresponding to a second frequency bin centered at the offset frequency below the center frequency of the assigned channel bandwidth.

17. The RF transmitter of claim 14, wherein the digital module is further configured to compute a difference between the at least one spectrum emission measurement and the spectrum emission limit to generate a current margin between the at least one spectrum emission measurement and the spectrum emission limit; and to compare the current margin to a minimum desired margin.

18. The RF transmitter of claim 17, wherein the digital module is further configured to increase the supply voltage to the PA if the current margin is lower than the minimum desired margin, and to decrease the supply voltage to the PA if the current margin exceeds the minimum desired margin by a predefined threshold.

19. A method for controlling a power amplifier (PA) in a radio frequency (RF) transmitter, comprising:
- performing a first spectrum emission measurement and a second spectrum emission measurement based on an output of the PA;
- comparing the first spectrum emission measurement and the second spectrum emission measurement; and
- adjusting a timing difference between an application time of a supply voltage to the PA and an application time of an input signal to the PA based at least in part on the comparison of the first and second spectrum emission measurements.

* * * * *

UNITED STATES PATENT AND TRADEMARK OFFICE
CERTIFICATE OF CORRECTION

PATENT NO. : 8,879,665 B2
APPLICATION NO. : 13/491175
DATED : November 4, 2014
INVENTOR(S) : Xia et al.

It is certified that error appears in the above-identified patent and that said Letters Patent is hereby corrected as shown below:

In the Specification

Column 1, line 42, replace "Evolved-Universal. Terrestrial" with --Evolved-Universal Terrestrial--.

Column 2, line 58, replace "MIR" with --ACLR--.

Column 7, line 11, replace "502," with --502.--.

Column 8, line 63, replace "$y_Q\cos(\theta_{NCO}) - y_I\sin(\theta_{NCO})$" with --$y_Q\cos(\theta_{NCO}) + y_I\sin(\theta_{NCO})$--.

Column 8, line 65, replace "$y_I\cos(\theta_{NCO}) - y_Q\sin(\theta_{NCO})$" with --$y_I\cos(\theta_{NCO}) + y_Q\sin(\theta_{NCO})$--.

In the Claims

Column 12, line 39, claim 11, replace "Rh" with --RF--.

Column 12, line 47, claim 11, replace "Rh" with --RF--.

Column 12, line 50, claim 12, replace "Rh" with --RF--.

Signed and Sealed this
Third Day of March, 2015

Michelle K. Lee
*Deputy Director of the United States Patent and Trademark Office*